United States Patent
Kajiyama et al.

(10) Patent No.: US 9,207,498 B2
(45) Date of Patent: Dec. 8, 2015

(54) PHOTO-ALIGNMENT EXPOSURE DEVICE AND PHOTO-ALIGNMENT EXPOSURE METHOD

(71) Applicant: V TECHNOLOGY CO., LTD., Kanagawa-ken (JP)

(72) Inventors: Koichi Kajiyama, Kanagawa (JP); Kazushige Hashimoto, Kanagawa (JP); Toshinari Arai, Kanagawa (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 0 days.

(21) Appl. No.: 14/412,917

(22) PCT Filed: Mar. 29, 2013

(86) PCT No.: PCT/JP2013/059577
§ 371 (c)(1),
(2) Date: Jan. 5, 2015

(87) PCT Pub. No.: WO2014/006944
PCT Pub. Date: Jan. 9, 2014

(65) Prior Publication Data
US 2015/0177568 A1  Jun. 25, 2015

(30) Foreign Application Priority Data
Jul. 5, 2012  (JP) .................... 2012-151630

(51) Int. Cl.
*G02F 1/1337* (2006.01)
*G03F 7/20* (2006.01)
*G02F 1/13* (2006.01)

(52) U.S. Cl.
CPC ........ *G02F 1/133788* (2013.01); *G02F 1/1303* (2013.01); *G02F 1/133753* (2013.01); *G03F 7/201* (2013.01); *G03F 7/70275* (2013.01); *G03F 7/70283* (2013.01); *G03F 7/70308* (2013.01); *G03F 7/70325* (2013.01); *G03F 7/70358* (2013.01); *G02F 2001/133757* (2013.01)

(58) Field of Classification Search
CPC ... G03F 7/0005; G03F 7/201; G03F 7/70275; G03F 7/70283; G03F 7/70308; G03F 7/70325; G03F 7/70358; G02F 1/133788; G02F 1/1303; G02F 1/33753; G02F 2001/133757
USPC .......................................... 430/321; 349/124
See application file for complete search history.

(56) References Cited

U.S. PATENT DOCUMENTS 5,587,822 A * 12/1996 Lee .............................. 349/124
6,583,835 B1    6/2003 Yoshida et al.
2009/0284703 A1  11/2009 Shoraku et al.

FOREIGN PATENT DOCUMENTS

JP  2003-161946 A * 6/2003
JP  2009/282552 A   12/2009

(Continued)

OTHER PUBLICATIONS

Computer-generated translation of JP 2003-161946 (Jun. 2003).*

(Continued)

*Primary Examiner* — John A McPherson
(74) *Attorney, Agent, or Firm* — Osha Liang LLP

(57) ABSTRACT

A photo-alignment exposure device that includes a first mask and a first exposure device that independently proximity-exposes a first divided area, a second mask and a second exposure device that independently proximity-exposes a second divided area adjacent to the first divided area, and a third mask and a third exposure device that exposes an area on a side of the first divided area near a boundary between the first divided area and the second divided area. The third exposure device is provided with a photo-irradiation angle same as that of the first exposure device or the second exposure device with respect to an exposed surface. A condensing element that condenses the mask transmitted light on the area on a side of the first divided area near the boundary is provided between the mask opening of the third mask and the exposed surface.

9 Claims, 5 Drawing Sheets

(56) References Cited

FOREIGN PATENT DOCUMENTS

| | | |
|---|---|---|
| JP | 2011-053721 A | 3/2011 |
| JP | 2012-063652 A | 3/2012 |
| WO | 07/066596 A1 | 6/2007 |

OTHER PUBLICATIONS

International Search Report issued in PCT/JP2013/059577 mailed on May 7, 2013 (2 pages).

* cited by examiner

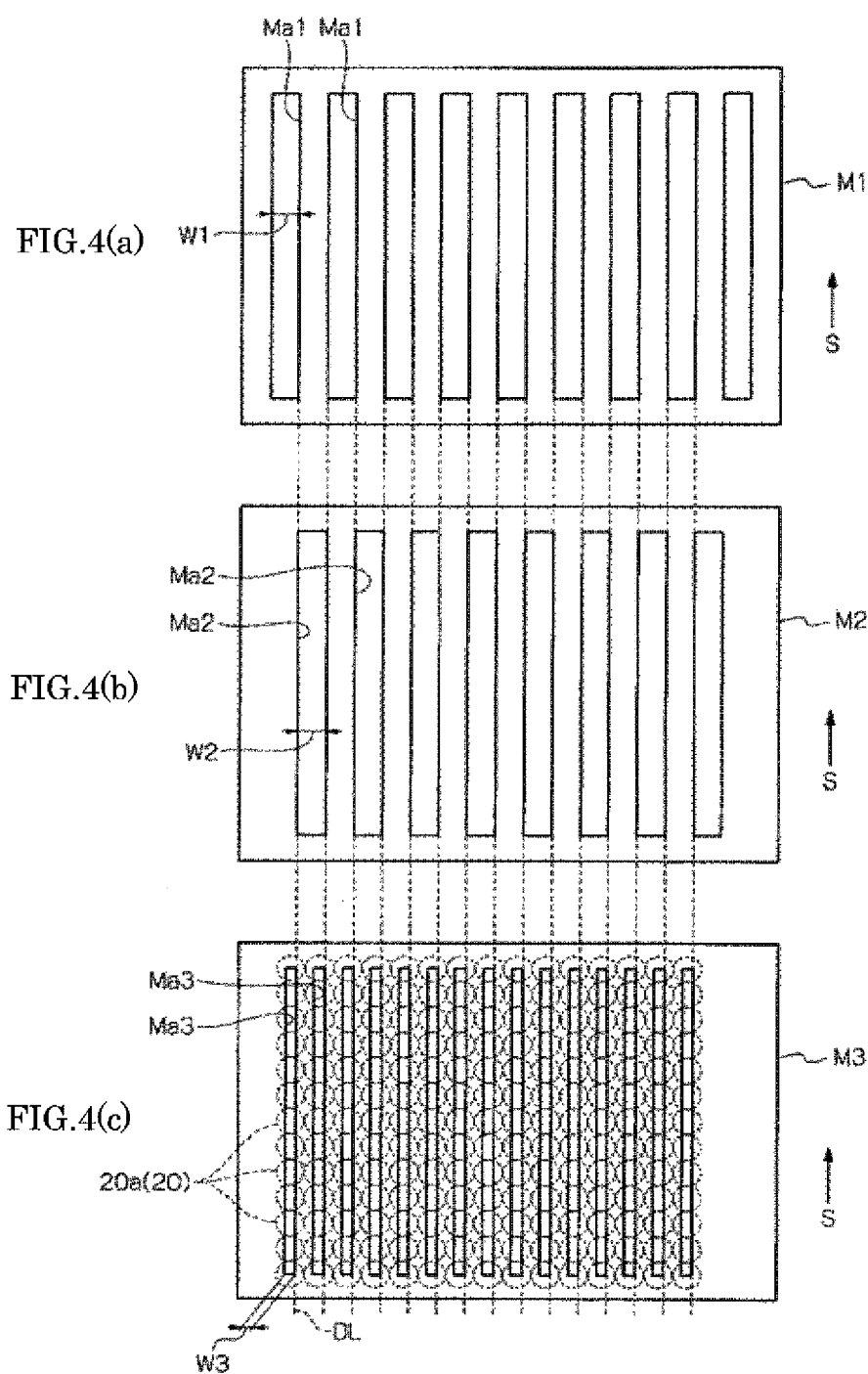

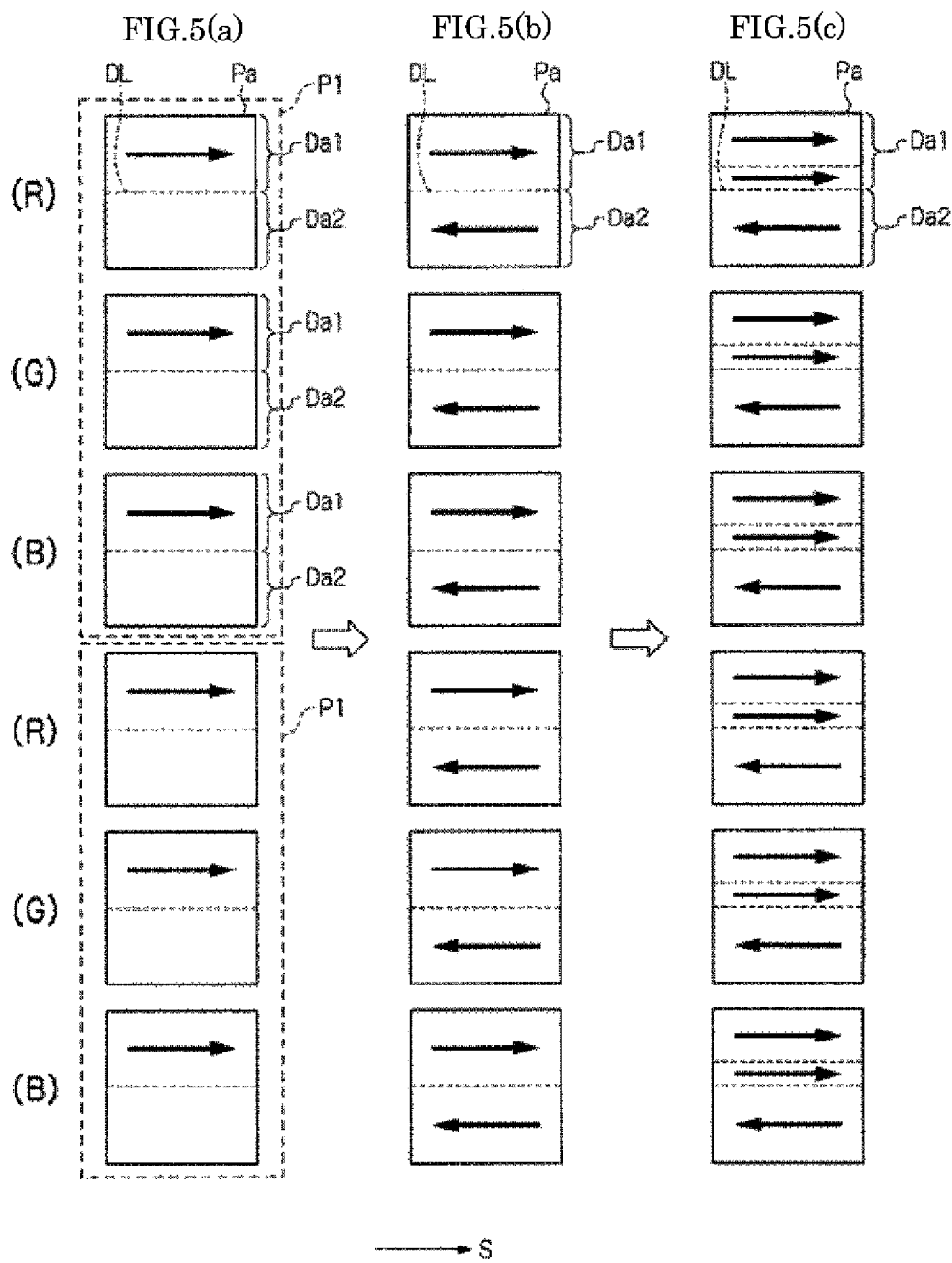

PHOTO-ALIGNMENT EXPOSURE DEVICE AND PHOTO-ALIGNMENT EXPOSURE METHOD

TECHNICAL FIELD

Embodiments of the invention relate to a photo-alignment exposure device and a photo-alignment exposure method that forms an alignment film of a liquid crystal display.

RELATED ART

A photo-alignment exposure system is known, in which a photosensitive polymeric membrane that is to serve as an alignment film is obliquely irradiated with an ultraviolet ray in order to define the size of the pre-tilt angle and alignment direction of liquid crystal, as a system that forms an alignment film of a liquid crystal display.

Meanwhile, the viewing angle of a liquid crystal panel is modified by dividing a single unit image area (a pixel or a sub-pixel, or an aggregation area thereof) of a liquid crystal display into two or more areas and changing the alignment direction of the liquid crystal for each divided area, and this method is called a pixel division method or a multi-domain method.

When the aforementioned photo-alignment exposure system is used in the multi-domain method, a plurality of ultraviolet ray exposure light beams is formed to be radiated at different angles onto an exposed surface on an alignment material film, the ultraviolet ray is radiated from one direction through one opening of a mask onto one area obtained by dividing the unit image area, and the ultraviolet ray is radiated from another direction through another opening of the mask onto another area obtained by dividing the unit image area. As a result, the photo-alignment treatment with different pre-tilt angles and alignment directions can be performed with respect to each of a plurality of areas obtained by dividing the unit image area.

In this case, with the conventional technique described in Patent Literature 1, each of a plurality of linearly arranged unit image areas is divided into two areas by a dividing line extending along the arrangement direction, and the plurality of unit image areas is scanning exposed by moving the exposed surface along the arrangement direction of the unit image areas, thereby continuously performing the photo-alignment treatment with respect to the plurality of unit image areas. With such conventional technique, two mask patterns are used that have an opening pattern corresponding to one divided area and an opening pattern corresponding to another area adjacent thereto. Each opening pattern is irradiated with exposure light, ultraviolet ray exposure light, along the scanning direction at a different angle with respect to the exposed surface, and the mask pattern is projection exposed (proximity-exposed) at the exposed surface, thereby performing the photo-alignment treatment in mutually different directions along the scanning direction with respect to two divided areas.

RELATED ART LITERATURE

Patent Literature

Patent Literature 1: Japanese Patent Application Publication No. 2012-63652

The exposure device used in the related art is provided, as depicted in FIG. 1(a), with a light source 1 emitting ultraviolet rays, a condenser lens 2 that converts the exposure light of the ultraviolet ray emitted from the light source 1 into parallel light and irradiates a mask M with the parallel light, and a fly-eye lens 3 (a lens array in which a plurality of unit lenses is arranged in a matrix configuration) that is disposed between the light source 1 and the condenser lens 2 and ensures uniform intensity distribution of the light radiated onto the mask M. The fly-eye lens 3 is arranged in a direction crossing the scanning direction S of an exposed surface Bs.

In such exposure device, as depicted in FIG. 1(b), a light L1 passing obliquely through the opening Ma of the mask M is generated by the condensing action of the fly-eye lens, and where this light L1 passes through the opening Ma of the mask M, the light is expanded by the collimation half-angle $\theta$ and the exposed surface Bs is irradiated thereby. As a result, in the exposed surface Bs, not only the area Me directly below the opening pattern of the mask M is irradiated, but the area outside the area Me is also irradiated by stray exposure light.

A photo-alignment exposure device such as depicted in FIG. 2(a) is used to perform the photo-alignment exposure by the multi-domain method with such an exposure device. In this case, a first mask M1 having an opening pattern that exposes one of the divided areas of the unit image area and a second mask M2 having an opening pattern that exposes the other divided area are disposed at a distance from each other above the exposed surface Bs, and a first exposure device Ex1 and a second exposure device Ex2 are provided to expose the exposed surface Bs of the exposed base plate B through the mask M1 and M2, respectively. The first exposure device Ex1 radiates ultraviolet ray exposure light, which is the exposure light along the scanning direction S, at an irradiation angle $\theta e$ (for example, 40°) onto the exposed surface Bs of the exposed base plate B, and the second exposure device Ex2 radiates ultraviolet ray exposure light, which is the exposure light along the scanning direction S, at an irradiation angle $-\theta e$ (for example, $-40°$) onto the exposed surface Bs of the exposed base plate B.

As a result, the exposure of divided areas Da1, Da2 in the single unit image area Pa is successively performed at an exposure intensity depicted in FIG. 2(b), and because of the stray exposure caused by the collimation half-angle depicted in FIG. 1(b), double exposure is performed in a range a close to the boundary of the divided areas Da1, Da2.

In this case, because the photoisomerization reaction is reversible in the alignment material, the correct photo-alignment can be obtained in the range a on the divided area Da2 side, but the photo-alignment in the desired direction cannot be obtained in the area a1 of the area a on the divided area Da1 side. The alignment disorder in the area a1 occurs due to the double exposure of insufficient intensity caused by the stray exposure resulting from the aforementioned collimation half-angle, and the width of the alignment disorder is about 10 μm to 15 μm. However, a transition to high-definition liquid crystal display panels created a demand for a smaller width of the unit image area Pa, and where a sufficient effective image area is to be ensured, such a width cannot be ignored.

SUMMARY OF THE INVENTION

Thus, one or more embodiments of the invention eliminate the alignment disorder near the boundary of the divided areas, which are obtained by dividing a unit image area, and ensuring an effective image area sufficient to narrow the unit image area when the photo-alignment exposure system is used in the multi-domain method.

The photo-alignment exposure device and photo-alignment exposure method in accordance with one or more embodiments of the invention include at least the following features.

A photo-alignment exposure device in which each unit image area of a liquid crystal display is divided into a plurality of divided areas and an alignment material film of the respective divided areas is photo-aligned in mutually different directions, the device including: a first mask and a first exposure device that independently proximity-exposes a first divided area which is one of the divided areas, a second mask and a second exposure device that independently proximity-exposes a second divided area which is one of the divided areas and adjacent to the first divided area, and a third mask and a third exposure device that exposes an area on a side of the first divided area near a boundary between the first divided area and the second divided area, wherein the third exposure device is provided with a photo-irradiation angle same as that of the first exposure device with respect to an exposed surface, and condensing element that condenses a mask transmitted light on the area on a side of the first divided area near the boundary is provided between a mask opening of the third mask and the exposed surface.

A photo-alignment exposure method in which each unit image area of a liquid crystal display is divided into a plurality of divided areas and an alignment material film of each of the divided areas is photo-aligned in mutually different directions, the method including: a first exposure process that independently proximity-exposes through a first mask a first divided area which is one of the divided areas, a second exposure process that independently proximity-exposes through a second mask a second divided area which is one of the divided areas and adjacent to the first divided area, and a third exposure process that exposes through a third mask an area on a side of the first divided area near a boundary of the first divided area and the second divided area, wherein in the third exposure process, exposure of an exposed surface is performed at a photo-irradiation angle same as that of the first exposure process, condensing element is disposed between a mask opening of the third mask and the exposed surface, and mask transmitted light is condensed on the area on a side of the first divided area near the boundary.

With such features, the area where an alignment disorder has occurred can be exposed with an intensity sufficient for photo-alignment by condensing the exposure by the third exposure device (exposure in the third exposure process) on the area where the alignment disorder has occurred with respect to the alignment disorder near the boundary of the first divided area and second divided area which occurs in the exposure by the first exposure device (exposure in the first exposure process) and the exposure by the second exposure device (exposure in the second exposure process). As a result, the photo-alignment of the area where the alignment disorder has occurred can be implemented in the same direction as the exposure by the first exposure device (exposure in the first exposure process).

With the photo-alignment exposure device and photo-alignment exposure method, the alignment disorder near the boundary of the divided areas obtained by dividing a unit image area can be eliminated and an effective image area sufficient to narrow the unit image area can be ensured when the photo-alignment exposure system is used in the multi-domain method.

BRIEF DESCRIPTION OF THE DRAWINGS

FIG. 3(a) depicts a configuration example of the photo-alignment exposure device, and FIG. 3(b) depicts an example of a base plate (exposed surface).

FIGS. 4(a), 4(b), and 4(c) are an explanatory drawing illustrating an example of masks for use in the photo-alignment exposure device according to one or more embodiments of the invention, wherein FIG. 4(a) depicts an example of the first mask, FIG. 4(b) depicts an example of the second mask, and FIG. 4(c) depicts an example of the third mask and a disposed example of the condensing element.

FIGS. 5(a), 5(b), and 5(c) are an explanatory drawing illustrating photo-alignment states on the exposed surface in the photo-alignment exposure method according to one or more embodiments of the invention.

DETAILED DESCRIPTION

Figure 1A:
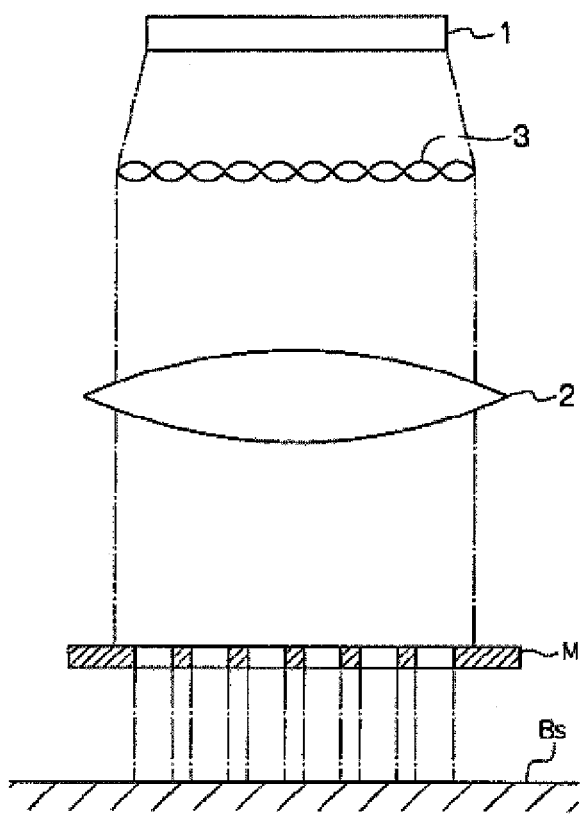
FIGS. 1(a) and 1(b) are an explanatory drawing illustrating the exposure device used in the related art.
Figure 1B:
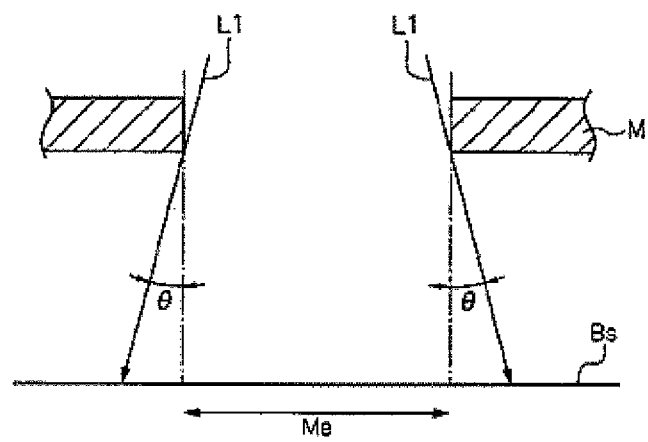
Figure 2A:
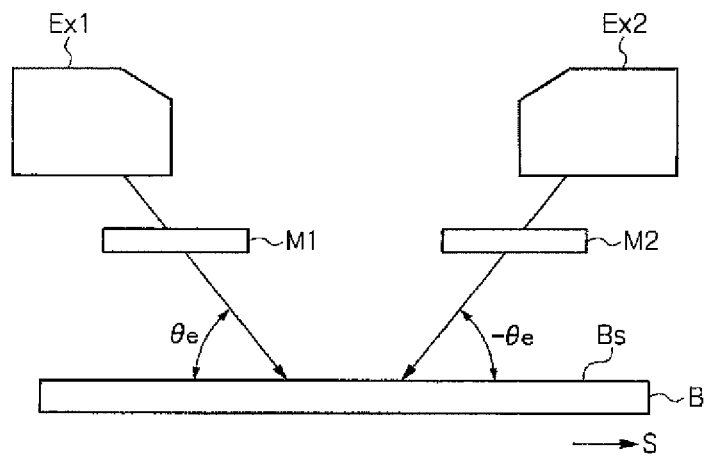
FIGS. 2(a) and 2(b) are an explanatory drawing illustrating the conventional photo-alignment exposure device.
Figure 2B:
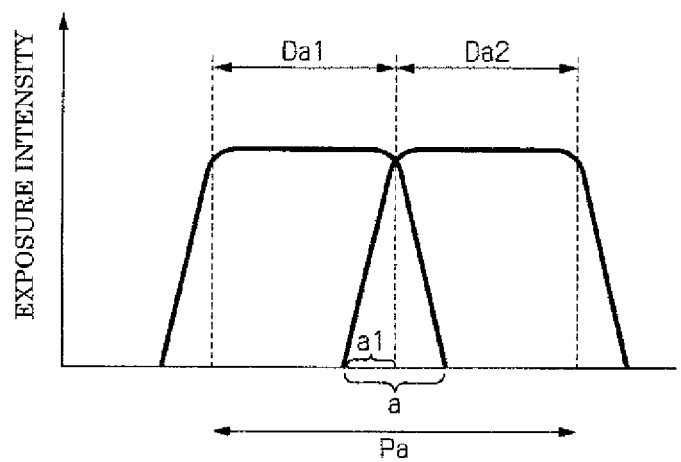
Figure 3A:
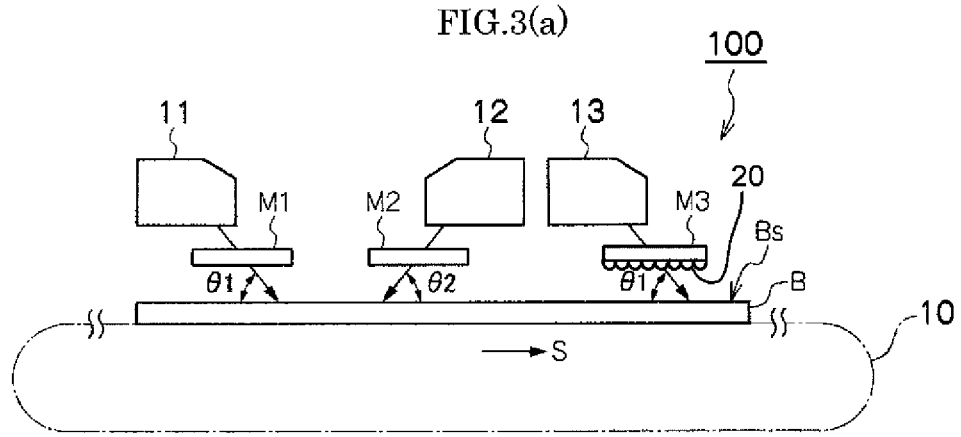
FIGS. 3(a) and 3(b) are an explanatory drawing illustrating the photo-alignment exposure device and photo-alignment exposure method according to one or more embodiments of the invention.

The embodiments of the invention will be explained hereinbelow with reference to the drawings. FIG. 3 is an explanatory drawing illustrating the photo-alignment exposure device and photo-alignment exposure method according to an embodiment of the present invention. FIG. 3(a) depicts a configuration example of the photo-alignment exposure device and FIG. 3(b) depicts an example of an exposed base plate (exposed surface).

Figure 3B:
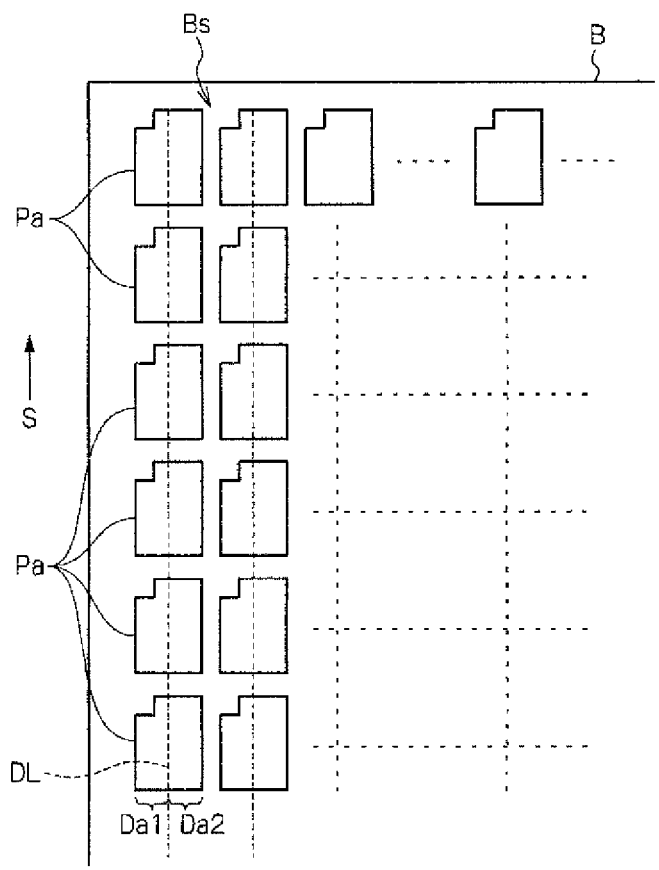

As depicted in FIG. 3(b), a photo-alignment exposure device 100 is a device that divides each unit image area Pa of a liquid crystal display into a plurality of divided areas Da1, Da2, and photo-aligning an alignment material film of the respective divided areas Da1, Da2 in mutually different directions. The alignment material film referred to herein is a photosensitive polymeric membrane demonstrating a reversible photoisomerization reaction, and the alignment with the desired pre-tilt angle and in the direction along the radiation direction is obtained in reaction to the ultraviolet ray radiated obliquely onto the surface of the alignment material film. The unit image area Pa, as referred to herein, indicates a pixel, or a sub-pixel obtained by dividing the interior of one pixel into a plurality of colors (R, G, B), or an aggregation area thereof.

As depicted in FIG. 3(a), a photo-alignment exposure device 100 is provided with a first mask M1 and a first exposure device 11, a second mask M2 and a second exposure device 12, and a third mask M3 and a third exposure device 13. The first mask M1 and the first exposure device 11 serve to independently proximity-expose a first divided area Da1 which is one of the divided areas. The second mask M2 and the second exposure device 12 serve to independently proximity-expose a second divided area Da2 which is one of the divided areas and adjacent to the first divided area Da1. The third mask M3 and a third exposure device 13 serve to overwrite expose an area on a side of the first divided area Da1 near the boundary (near the dividing line DL) of the first divided area Da1 and the second divided area Da2.

The first exposure device 11 includes a light source radiating, an ultraviolet ray and an optical system that radiates the light emitted from the light source at the inclination angle θ1 (for example 40°) onto an exposed surface Bs of an exposed base plate B where the alignment material film has been formed. Similarly to the first exposure device 11, the second exposure device 12 is provided with a light source radiating, an ultraviolet ray and an optical system that radiates the light emitted from the light source at the inclination angle θ2 (=−θ1) onto the exposed surface Bs.

Similarly to the first and second exposure devices 11 and 12, the third exposure device 13 is provided with a light source radiating ultraviolet rays and an optical system that radiates the light emitted from the light source onto the exposed surface Bs at an inclination angle θ1. The angle (photo-irradiation angle) of the third exposure device 13 with respect to the exposed surface Bs is the same as the photo-irradiation angle (θ1) of the first exposure device 11. The optical system of each of the first, second, and third exposure devices 11, 12, 13 includes, for example, a fly-eye lens and a collimator lens, in the same manner as in the conventional exposure device.

Condensing element (condensing lens) 20 that condenses a mask transmitted light on the area on a side of the first divided area Da1 near the boundary (near the divided line DL) of the first divided area Da1 and second divided area Da2 is provided between the mask opening of the third mask M3 and the exposed surface Bs.

With the photo-alignment exposure device 100 of such a configuration, the area where an alignment disorder has occurred can be exposed with an intensity sufficient for photo-alignment by condensing the exposure by the third exposure device 13 on the area where the alignment disorder has occurred with respect to the alignment disorder near the boundary of the first divided area Da1 and the second divided area Da2 which occurs in the exposure by the first exposure device 11 and the exposure by the second exposure device 12. As a result, the photo-alignment of the area where the alignment disorder has occurred can be implemented in the same direction as the exposure by the first exposure device 11.

The photo-alignment exposure device 100 according to the embodiment illustrated by FIG. 3 is explained hereinbelow in greater detail. The photo-alignment exposure device 100 according to the present embodiment is provided with base plate scanning part 10, and the exposed base plate B having the exposed surface Bs is moved by the base plate scanning part 10 along the scanning direction S. The scanning direction S is the arrangement direction of the plurality of unit image areas Pa which is along the dividing line DL.

Further, the first mask M1 and the first exposure device 11, the second mask M2 and the second exposure device 12, and the third mask M3 and the third exposure device 13 are sequentially disposed with a spacing along the scanning direction S. The first exposure device 11 and the second exposure device 12 radiate ultraviolet ray exposure light, which is exposure light along the scanning direction S, at different angles (θ1, θ2) onto the exposed surface Bs. The third exposure device 13 radiates ultraviolet ray exposure light, which is exposure light along the scanning direction S, at the angle θ1 onto the exposed surface Bs.

With the photo-alignment exposure device 100 of such a configuration, initially, in the first process (first exposure process), the first divided area Da1 of the exposed surface Bs moving along the scanning direction S is independently proximity-exposed by the first exposure device 11 through the first mask M1. In the subsequent second process (second exposure process), the second divided area Da2 is independently proximity-exposed by the second exposure device 12 through the second mask M2. Then, in the third process (third exposure process), the area on a side of the first divided area Da1 near the boundary (near the dividing line DL) of the first divided area Da1 and the second divided area Da2 is overwrite exposed by the third exposure device 13 through the third mask M3. In the third process (third exposure process), the exposure of the exposed surface Bs is performed at a photo-irradiation angle (angle θ1) same as that of the first exposure process, and the mask transmitted light is condensed by the condensing element 20 disposed between the mask opening of the third mask M3 and the exposed surface Bs in the area on a side of the first divided area Da1 near the boundary of the first divided area Da1 and the second divided area Da2.

FIG. 4 is an explanatory drawing illustrating an example of masks for use in the photo-alignment exposure device according to the embodiment of the present invention. FIG. 4(a) depicts an example of the first mask. FIG. 4(b) depicts an example of the second mask. FIG. 4(c) depicts an example of the third mask and a disposed example of the condensing element.

As depicted in FIG. 3(b), when the unit image areas Pa are disposed in a dot matrix configuration, a plurality of slit-shaped opening patterns are formed, as shown in FIG. 4(a), in the first mask M1 corresponding thereto. In this example, each opening Ma1 is disposed on the first divided area Da1 on the exposed surface Bs, and has an opening width W1 substantially equal to that of the divided area Da1. In the slit-shaped opening pattern, a plurality of openings Ma1 are parallel to each other and disposed side by side in the direction crossing the scanning direction S.

By contrast, in the second mask M2, as depicted in FIG. 4(b), an opening pattern is formed as a plurality of slits at positions shifted by the opening width W1 with respect to the first mask M1. Individual openings Ma2 are disposed on the second divided area Da2 on the exposed surface Bs, and the openings Ma2 have the opening width W2 substantially equal to that of the second divided area Da2. In the slit-shaped opening pattern, a plurality of openings Ma2 are parallel to each other and disposed side by side in the direction orthogonal to the scanning direction S.

In the third mask M3, as depicted in FIG. 4(c), the opening pattern is formed as a plurality of slits on the first divided area Da1 side of the dividing line DL which is the boundary of the first divided area Da1 and the second divided area Da2. The width W3 of the opening Ma3 is set, as appropriate, according to the condensing function of the condensing element 20 and the distance between the mask M3 and the exposed surface Bs.

With respect to the third mask M3, the condensing element 20 can be configured, for example, as a microlens array in which respective single lenses 20a are disposed on the light transmission side of the openings Ma3. The condensing function of the single lens 20a is set such that the mask transmitted light is condensed to the width of the occurrence area of the alignment disorder occurring due to the exposure (exposure in the first exposure process) by the first exposure device 11 and the exposure (exposure in the second exposure process) by the second exposure device 12. The condensing element 20 is not limited to this example, and a cylindrical lens (semi-cylindrical convex lens) may be individually disposed in each opening Ma3, or a lenticular lens in which a plurality of semi-cylindrical convex lenses are integrated may be used.

FIG. 5 is an explanatory drawing illustrating the photo-alignment state on the exposed surface Bs which is obtained in the photo-alignment exposure method according to the embodiment of the present invention. FIG. 5(a) depicts the photo-alignment state obtained in the first exposure process, FIG. 5(b) depicts the photo-alignment state obtained in the second exposure process, and FIG. 5(c) depicts the photo-alignment state obtained in the third exposure process. In the example depicted in the figures, a sub-pixel obtained by dividing one pixel P1 into RGB colors is taken as a unit image area Pa, and each sub-pixel is divided into the first divided area Da1 and the second divided area Da2.

In the first exposure process using the first mask M1 depicted in FIG. 4(a), photo-alignment in the same direction as the scanning direction S is performed independently in each first divided area Da1, as depicted in FIG. 5(a). Then, in the second exposure process using the second mask M2 depicted in FIG. 4(b), photo-alignment in the direction opposite to the scanning direction S is performed independently in each second divided area Da2, as depicted in FIG. 5(b). Then, in the third exposure process using the condensing element 20 and the third mask M3 depicted in FIG. 4(c), photo-alignment in the same direction as the scanning direction S is performed in the area on the first divided area Da1 side along the dividing line DL near the boundary of each first divided area Da1 and each second divided area Da2, as depicted in FIG. 5(c).

With the photo-alignment exposure method using the photo-alignment exposure device 100 having such features, the alignment disorder can be suppressed in the entire area in the unit image areas Pa, and the interior of the unit image areas Pa can be obtained as an area photo-aligned in one direction and an area photo-aligned in another direction. Therefore, an effective image area sufficient to narrow the unit image area Pa when the photo-alignment exposure system is used in the multi-domain method can be ensured.

The embodiments of the present invention are explained hereinabove with reference to the drawings, but the specific features are not limited to those embodiments, and design changes which do not depart from the essence of the present invention are also included in the present invention. In particular, in the embodiment depicted in FIG. 3, the exposed base plate B is moved (scanned), but this embodiment is not limiting, and the first exposure process, second exposure process, and third exposure process may be also sequentially implemented with respect to the fixed exposed base plate B.

EXPLANATION OF REFERENCE NUMERALS

1: light source, 2: condenser lens, 3: fly-eye lens
M: mask, M1: first mask, M2: second mask, M3: third mask
B: exposed base plate, Bs: exposed surface
P1: pixel, Pa: unit image area
Da1: first divided area, Da2: second divided area, DL: dividing line
10: base plate scanning part
11: first exposure device, 12: second exposure device, 13: third exposure device
20: condensing element, 20a: single lens
S: scanning direction

What is claimed is:

1. A photo-alignment exposure device in which each unit image area of a liquid crystal display is divided into a plurality of divided areas and an alignment material film of each of the divided areas is photo-aligned in mutually different directions, said device comprising:
a first mask and a first exposure device that independently proximity-exposes a first divided area which is one of said divided areas, a second mask and a second exposure device that independently proximity-exposes a second divided area which is one of said divided areas and is adjacent to the first divided area, and a third mask and a third exposure device that exposes an area on a side of said first divided area near a boundary between said first divided area and said second divided area, wherein
said third exposure device is provided with a photo-irradiation angle same as that of said first exposure device with respect to an exposed surface, and
condensing element that condenses mask transmitted light on said area on a side of said first divided area near said boundary is provided between a mask opening of said third mask and the exposed surface.

2. The photo-alignment exposure device according to claim 1, comprising
base plate scanning part that scans a base plate having said exposed surface along a dividing line to divide into said divided areas and an arrangement direction of said plurality of image areas, wherein
said first mask and said first exposure device, said second mask and said second exposure device, and said third mask and said third exposure device are sequentially disposed with a spacing along a scanning direction of said base plate scanning part; and
said first exposure device and said second exposure device radiate ultraviolet ray exposure light, which is exposure light along said scanning direction, at different angles onto the exposed surface.

3. The photo-alignment exposure device according to claim 2, wherein said condensing element is a microlens array in which single lenses are disposed on a light transmission side of plurality of mask openings in said third mask.

4. The photo-alignment exposure device according to claim 3, wherein said unit image area is a sub-pixel obtained by dividing an interior of one pixel into a plurality of colors.

5. The photo-alignment exposure device according to claim 2, wherein said unit image area is a sub-pixel obtained by dividing an interior of one pixel into a plurality of colors.

6. The photo-alignment exposure device according to claim 1, wherein said condensing element is a microlens array in which single lenses are disposed on a light transmission side of plurality of mask openings in said third mask.

7. The photo-alignment exposure device according to claim 6, wherein said unit image area is a sub-pixel obtained by dividing an interior of one pixel into a plurality of colors.

8. The photo-alignment exposure device according to claim 1, wherein said unit image area is a sub-pixel obtained by dividing an interior of one pixel into a plurality of colors.

9. A photo-alignment exposure method by which each unit image area of a liquid crystal display is divided into a plurality of divided areas and an alignment material film of each of the divided areas is photo-aligned in mutually different directions, said method comprising:
a first exposure process that independently proximity-exposes through a first mask a first divided area which is one of said divided areas, a second exposure process that independently proximity-exposes through a second mask a second divided area which is one of said divided areas and adjacent to said first divided area, and a third exposure process that exposes through a third mask an area on a side of said first divided area near a boundary between said first divided area and said second divided area, wherein
in said third exposure process, exposure of an exposed surface is performed at a photo-irradiation angle same as that in said first exposure process, condensing element is disposed between a mask opening of said third mask and the exposed surface, and mask transmitted light is condensed on a side of said area on said first divided area near said boundary.

* * * * *